(12) United States Patent
Honda (10) Patent No.: US 8,351,271 B2
(45) Date of Patent: Jan. 8, 2013

(54) SEMICONDUCTOR STORAGE APPARATUS INCLUDING A PUMP CIRCUIT FOR THE ACTIVE MODE AND THE STANDBY MODE

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 12/656,999

(22) Filed: Feb. 23, 2010

(65) Prior Publication Data

US 2010/0214836 A1   Aug. 26, 2010

(30) Foreign Application Priority Data

Feb. 24, 2009   (JP) .................................. 2009-40633

(51) Int. Cl.
*G11C 11/34* (2006.01)

(52) U.S. Cl. ................................. 365/185.23

(58) Field of Classification Search .................. 365/229, 365/226, 185.23; 327/157, 148
See application file for complete search history.

(56) References Cited

U.S. PATENT DOCUMENTS

| | | | | |
|---|---|---|---|---|
| 6,429,725 | B1 * | 8/2002 | Tanzawa et al. | 327/536 |
| 2005/0213412 | A1 * | 9/2005 | Miki | 365/226 |
| 2008/0054991 | A1 * | 3/2008 | Maejima | 327/536 |
| 2009/0115500 | A1 * | 5/2009 | Kuwagata et al. | 327/538 |

FOREIGN PATENT DOCUMENTS

| | | |
|---|---|---|
| JP | A-07-085678 | 3/1995 |
| JP | A-2000-089837 | 3/2000 |
| JP | A-2000-105998 | 4/2000 |
| JP | A-2000-268575 | 9/2000 |
| JP | 2007129810 A * | 5/2007 |

OTHER PUBLICATIONS

Background Art Information Sheet provided by applicants (Oct. 26, 2009) (3 pages total).

* cited by examiner

*Primary Examiner* — VanThu Nguyen
*Assistant Examiner* — Khamdan Alrobaie
(74) *Attorney, Agent, or Firm* — Posz Law Group, PLC (57) ABSTRACT

A semiconductor storage apparatus has a control circuit. The control circuit deactivates the first and second amplifier circuits, turns off the first, second, fourth and fifth switch circuits, and turns on the third and sixth switch circuits in response to an external signal based on reduction of current dissipation of a power supply which supplies the power supply voltage.

20 Claims, 8 Drawing Sheets

SEMICONDUCTOR STORAGE APPARATUS INCLUDING A PUMP CIRCUIT FOR THE ACTIVE MODE AND THE STANDBY MODE

CROSS-REFERENCE TO RELATED APPLICATION

This application is based upon and claims the benefit of priority from the prior Japanese Patent Application No. 2009-40633, filed on Feb. 24, 2009, the entire contents of which are incorporated herein by reference.

BACKGROUND OF THE INVENTION

1. Field of the Invention

The present invention relates to a semiconductor storage apparatus including a plurality of pump circuits.

2. Background Art

In a semiconductor storage apparatus such as, for example, a NOR flash memory formed of an EEPROM, a voltage higher than the power supply voltage is needed when writing data into memory cells or erasing data from memory cells.

In such a semiconductor storage apparatus which needs the high voltage, a pump circuit is included and the needed high voltage is generated by boosting the power supply voltage in the pump circuit.

Some conventional semiconductor storage apparatuses include, for example, a standby pump circuit which operates according to an output voltage at the time of standby operation and an active pump circuit which operates according to the output voltage at the time of active operation (see, for example, JP-A 2000-105998 (KOKAI), JP-A 2000-268575 (KOKAI), and JP-A 07-85678 (KOKAI)).

SUMMARY OF THE INVENTION

According to one aspect of the present invention, there is provided: a semiconductor storage apparatus comprising:

an output terminal;

a pool capacitor connected between the output terminal and ground;

a first voltage divider circuit connected between the output terminal and the ground to output a first monitor voltage obtained by dividing a voltage which is output from the output terminal with a first voltage division ratio;

a first switch circuit connected between the output terminal and the first voltage divider circuit;

a second switch circuit connected between the first voltage divider circuit and the ground;

a third switch circuit connected between a first potential which is higher than a reference voltage and the first voltage divider circuit;

a first amplifier circuit which compares the first monitor voltage with the reference voltage, outputs a first boost signal if the first monitor voltage is lower than the reference voltage, and outputs a first stop signal if the first monitor voltage is higher than the reference voltage;

a first pump circuit which outputs a voltage obtained by boosting a power supply voltage to the output terminal in response to the first boost signal;

a second voltage divider circuit connected between the output terminal and the ground to output a second monitor voltage obtained by dividing a voltage which is output from the output terminal with a second voltage division ratio, the second voltage division ratio being equal to the first voltage division ratio, the second voltage divider circuit being greater in resistance value than the first voltage divider circuit;

a fourth switch circuit connected between the output terminal and the second voltage divider circuit;

a fifth switch circuit connected between the second voltage divider circuit and the ground;

a sixth switch circuit connected between the first potential which is higher than the reference voltage and the second voltage divider circuit;

a second amplifier circuit which compares the second monitor voltage with the reference voltage, outputs a second boost signal if the second monitor voltage is lower than the reference voltage, and outputs a second stop signal if the second monitor voltage is higher than the reference voltage;

a second pump circuit which outputs a voltage obtained by boosting the power supply voltage to the output terminal in response to the second boost signal, the second pump circuit being lower in boosting capability than the first pump circuit;

a control circuit which controls activation/deactivation of the first amplifier circuit and the second amplifier circuit, and controls on/off of the first to sixth switch circuits;

a memory cell which stores data; and a decoder which supplies a voltage depending upon the boost voltage output from the output terminal, to the memory cell, wherein the control circuit deactivates the first and second amplifier circuits, turns off the first, second, fourth and fifth switch circuits, and turns on the third and sixth switch circuits in response to an external signal based on reduction of current dissipation of a power supply which supplies the power supply voltage.

DETAILED DESCRIPTION

For example, in the NOR flash memory, it is necessary to always pool a boost voltage (VDDR) for readout across a pool capacitor, for a readout instruction (random access) generated at random.

A power supply circuit for the NOR flash memory supplements charges by an amount dissipated by random access. This power supply circuit includes an active pump circuit, which is triggered by occurrence of random access to supply charges during a determinate period of time, and a standby pump circuit, which always holds a potential of the boost voltage VDDR even if random access does not occur. Also, in the active pump circuit, the response speed is set so as to be fast (the composite resistance value of the voltage divider circuit for boost voltage detection is set so as to be small) and the supply capability is set so as to be large. In the standby pump circuit, the response speed is set so as to be slow (the composite resistance value of the voltage divider circuit for boost voltage detection is set so as to be large) and the supply capability is set so as to be small.

In such a power supply circuit, the boost voltage VDDR is controlled by controlling on/off of these pump circuits.

Operation time in random access is, for example, approximately 100 ns. On the other hand, approximately the same period of time is required to detect lowering of the boost voltage VDDR, activate the pump circuit, and supply a current.

As regards the random access, therefore, there are no ways other than previously storing charges corresponding to the dissipated current in the pool capacitor. As a result, the standby pump circuit is needed. Since the standby pump circuit is provided for a purpose of keeping the boost voltage VDDR at a predetermined potential, its supply capability is small as already described.

As for the current dissipation at the time of standby operation as well, power saving is demanded. As regards the standby pump circuit, therefore, it is necessary to suppress the current dissipation. As already described, therefore, the standby pump circuit has a response speed which is set so as to be slow.

In recent years, the NOR flash memory is demanded to be in the DPD (Deep Power Down) state to further reduce the current dissipation in the standby state when it is not accessed for some time. In the NOR flash memory in the DPD state, the standby pump circuit is also stopped to reduce the current dissipation.

The above described conventional art has the following disadvantage. If boosting is conducted by using only the standby pump circuit when the NOR flash memory is restored from the DPD state, a long restoration time is taken because the supply capability is small.

Furthermore, since the response speed of the standby pump circuit is slow, the monitor voltage (hereafter referred to as VMONS) oscillates slightly. This results in a disadvantage that false detection occurs and the VDDR becomes higher than a desired potential.

Hereafter, according to the disadvantage the applicant found mentioned above, each embodiment to which the present invention is applied will be described with reference to the drawings.

In the ensuing embodiments, for example, examples in which the present invention is applied to the NOR flash memory, which is a semiconductor storage apparatus, will be described. Also, the semiconductor storage apparatus according to the present invention can be applied to other semiconductor storage apparatuses such as a NAND flash memory requiring the boost voltage.

FIRST EMBODIMENT

Figure 1:
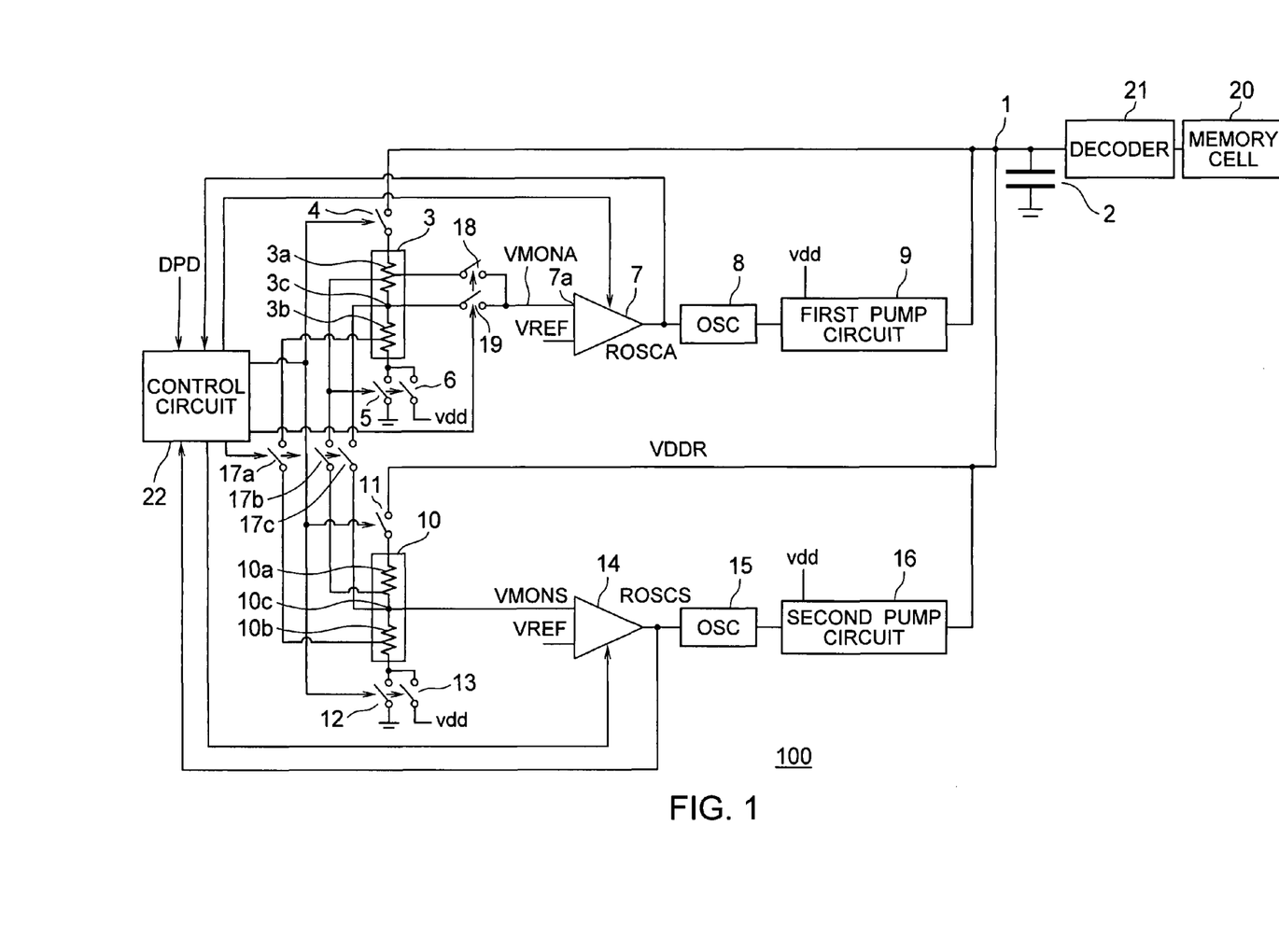
FIG. 1 is a diagram showing an example of a configuration of a semiconductor storage apparatus 100 according to a first embodiment, which is a mode of the present invention.

FIG. 1 is a diagram showing an example of a configuration of a semiconductor storage apparatus 100 according to a first embodiment, which is a mode of the present invention.

As shown in FIG. 1, the semiconductor storage apparatus 100 includes an output terminal 1, a pool capacitor 2, a first voltage divider circuit 3, a first switch circuit 4, a second switch circuit 5, a third switch circuit 6, a first amplifier circuit 7, a first voltage controlled oscillator (OSC) 8, a first pump circuit 9, a second voltage divider circuit 10, a fourth switch circuit 11, a fifth switch circuit 12, a sixth switch circuit 13, a second amplifier circuit 14, a second voltage controlled oscillator (OSC) 15, a second pump circuit 16, seventh switch circuits 17a, 17b and 17c, an eighth switch circuit 18, a ninth switch circuit 19, a memory cell 20, a decoder 21, and a control circuit 22.

The pool capacitor 2 is connected between the output terminal 1 and ground. The pool capacitor 2 is charged and discharged according to a voltage supplied to the output terminal 1. As a result, the potential at the output terminal 1 is stabilized.

The first voltage divider circuit 3 is connected between the output terminal 1 and the ground. The first voltage divider circuit 3 includes voltage dividing resistors 3a and 3b connected in series. A voltage which is output from the output terminal 1 is divided with a first voltage division ratio D1 by the voltage dividing resistors 3a and 3b.

The first voltage divider circuit 3 is adapted to output a first monitor voltage VMONA obtained by dividing the voltage which is output from the output terminal 1 with the first voltage division ratio D1, from a first node 3c between the voltage dividing resistors 3a and 3b.

The first switch circuit 4 is connected between the output terminal 1 and the first voltage divider circuit 3.

The second switch circuit 5 is connected between the first voltage divider circuit 3 and the ground.

The third switch circuit 6 is connected between a first potential which is higher than a reference voltage VREF and the first voltage divider circuit 3. In the first embodiment, the first potential is a power supply voltage Vdd. Therefore, the power supply voltage Vdd is applied to the first voltage divider circuit 3 by turning on the third switch circuit 6.

The first amplifier circuit 7 compares the first monitor voltage VMONA with the reference voltage VREF, and outputs a signal ROSCA which depends upon a result of the comparison. In other words, when the first amplifier circuit 7 compares the first monitor voltage VMONA with the reference voltage VREF, the first amplifier circuit 7 outputs a first boost signal (ROSCA="High" level) if the first monitor voltage VMONA is lower than the reference voltage VREF. Meanwhile, when the first amplifier circuit 7 compares the first monitor voltage VMONA with the reference voltage VREF, the first amplifier circuit 7 outputs a first stop signal (ROSCA="Low" level) if the first monitor voltage VMONA is higher than the reference voltage VREF.

The first voltage controlled oscillator 8 is adapted to output a first clock signal having a predetermined frequency in response to the first boost signal, if the first amplifier circuit 7 outputs the first boost signal. If the first amplifier circuit 7 outputs the first stop signal, the first voltage controlled oscillator 8 stops outputting of the first clock signal in response to the first stop signal.

The first pump circuit (active pump circuit) 9 is adapted to output a voltage obtained by boosting the power supply voltage Vdd to the output terminal 1, in response to the first clock signal which is output by the first voltage controlled oscillator 8. In other words, the first pump circuit 9 is adapted to output the voltage obtained by boosting the power supply voltage Vdd, to the output terminal 1 in response to the first boost signal.

The second voltage divider circuit 10 is connected between the output terminal 1 and the ground. The second voltage divider circuit 10 includes voltage dividing resistors 10a and 10b connected in series. A voltage which is output from the output terminal 1 is divided with a second voltage division ratio D2 by the voltage dividing resistors 10a and 10b. The second voltage division ratio D2 is set so as to become equal to the first voltage division ratio D1. The second voltage divider circuit 10 is adapted to output a second monitor voltage VMONS obtained by dividing the voltage which is output from the output terminal 1 with the second voltage division ratio D2, from a second node 10c between the voltage dividing resistors 10a and 10b.

Especially, a composite resistance value of the voltage dividing resistors 10a and 10b is set so as to make a composite resistance value of the second voltage divider circuit 10 larger than a composite resistance value of the first voltage divider circuit 3. Therefore, a response speed of the second voltage divider circuit 10 is faster than that of the first voltage divider circuit 3. In other words, a through current flowing through the second voltage divider circuit 10 becomes smaller than that flowing through the first voltage divider circuit 3.

The fourth switch circuit 11 is connected between the output terminal 1 and the second voltage divider circuit 10.

The fifth switch circuit 12 is connected between the second voltage divider circuit 10 and the ground.

The sixth switch circuit 13 is connected between the first potential (power supply voltage Vdd) which is higher than the reference voltage VREF and the second voltage divider circuit 10. Therefore, the power supply voltage Vdd is applied to the second voltage divider circuit 10 by turning on the sixth switch circuit 13.

The second amplifier circuit 14 compares the second monitor voltage VMONS with the reference voltage VREF, and outputs a signal ROSCS which depends upon a result of the comparison. In other words, when the second amplifier circuit 14 compares the second monitor voltage VMONS with the reference voltage VREF, the second amplifier circuit 14 outputs a second boost signal (ROSCS="High" level) if the second monitor voltage VMONS is lower than the reference voltage VREF. Meanwhile, when the second amplifier circuit 14 compares the second monitor voltage VMONS with the reference voltage VREF, the second amplifier circuit 14 outputs a second stop signal (ROSCS="Low" level) if the second monitor voltage VMONS is higher than the reference voltage VREF.

The second voltage controlled oscillator 15 is adapted to output a second clock signal having a predetermined frequency in response to the second boost signal, if the second amplifier circuit 14 outputs the second boost signal. If the second amplifier circuit 14 outputs the second stop signal, the second voltage controlled oscillator 15 stops outputting of the second clock signal in response to the second stop signal.

The second pump circuit (standby pump circuit) 16 is adapted to output a voltage obtained by boosting the power supply voltage Vdd to the output terminal 1, in response to the second clock signal which is output by the second voltage controlled oscillator 15. In other words, the second pump circuit 16 is adapted to output the voltage obtained by boosting the power supply voltage Vdd, to the output terminal 1 in response to the second boost signal. The second pump circuit 16 is set so as to have a boosting capability which is lower than that of the first pump circuit 9.

The seventh switch circuits 17a, 17b and 17c are connected between the first voltage divider circuit 3 and the second voltage divider circuit 10 so as to maintain the first voltage division ratio D1 in the first voltage divider circuit 3 and the second voltage division ratio D2 in the second voltage divider circuit 10 when the seventh switch circuits 17a, 17b and 17c are turned on. The first voltage divider circuit 3 and the second voltage divider circuit 10 are short-circuited by turning on the seventh switch circuits 17a, 17b and 17c, and a composite resistance value obtained from the two voltage divider circuits becomes smaller than the composite resistance value of the second voltage divider circuit 10.

The eighth switch circuit 18 is connected between an input terminal 7a of the first amplifier circuit 7 to which the first monitor voltage VMONA is input and a part 3a1 of the voltage dividing resistor 3a.

The ninth switch circuit 19 is connected between the input terminal 7a of the first amplifier circuit 7 to which the first monitor voltage VMONA is input and the node 3c.

The first monitor voltage VMONA which is output from the first node 3c is input to the input terminal 7a of the first amplifier circuit 7 by turning off the eighth switch circuit 18 and turning on the ninth switch circuit 19. Meanwhile, a voltage at the part 3a1 of the voltage dividing resistor 3a is input to the input terminal 7a of the first amplifier circuit 7 as the first monitor voltage VMONA by turning on the eighth switch circuit 18 and turning off the ninth switch circuit 19.

By turning on the eighth switch circuit 18 and turning off the ninth switch circuit 19, a voltage obtained by dividing the voltage which is output from the output terminal 1 with a resistor component of the first voltage divider circuit 3 located on the output terminal 1 side as compared with the part 3a1 of the voltage dividing resistor 3a and a resistor component of the first voltage divider circuit 3 located on the ground side as compared with the part 3a1 of the voltage dividing resistor 3a apparently becomes the first monitor voltage VMONA. In other words, the first voltage division ratio D1 in the first voltage divider circuit 3 becomes greater than the second voltage division ratio D2 in the second voltage divider circuit 10, and the first monitor voltage VMONA rises.

The memory cell 20 is adapted to be formed of, for example, memory cell transistors and store data in accordance with a threshold voltage.

The decoder 21 is adapted to supply a voltage depending upon the boost voltage VDDR, which is output from the output terminal 1, to the memory cell 20.

The control circuit 22 is adapted to be supplied with a deep power down signal DPD which prescribes on/off of the power supply, the signal ROSCA which is output by the first amplifier circuit 7, and the signal ROSCS which is output by the second amplifier circuit 14. The control circuit 22 is adapted to control activation/deactivation of the first amplifier circuit 7 and the second amplifier circuit 14 and control on/off of the first to ninth switch circuits 4 to 6, 11 to 13 and 17 to 19.

Figure 2:
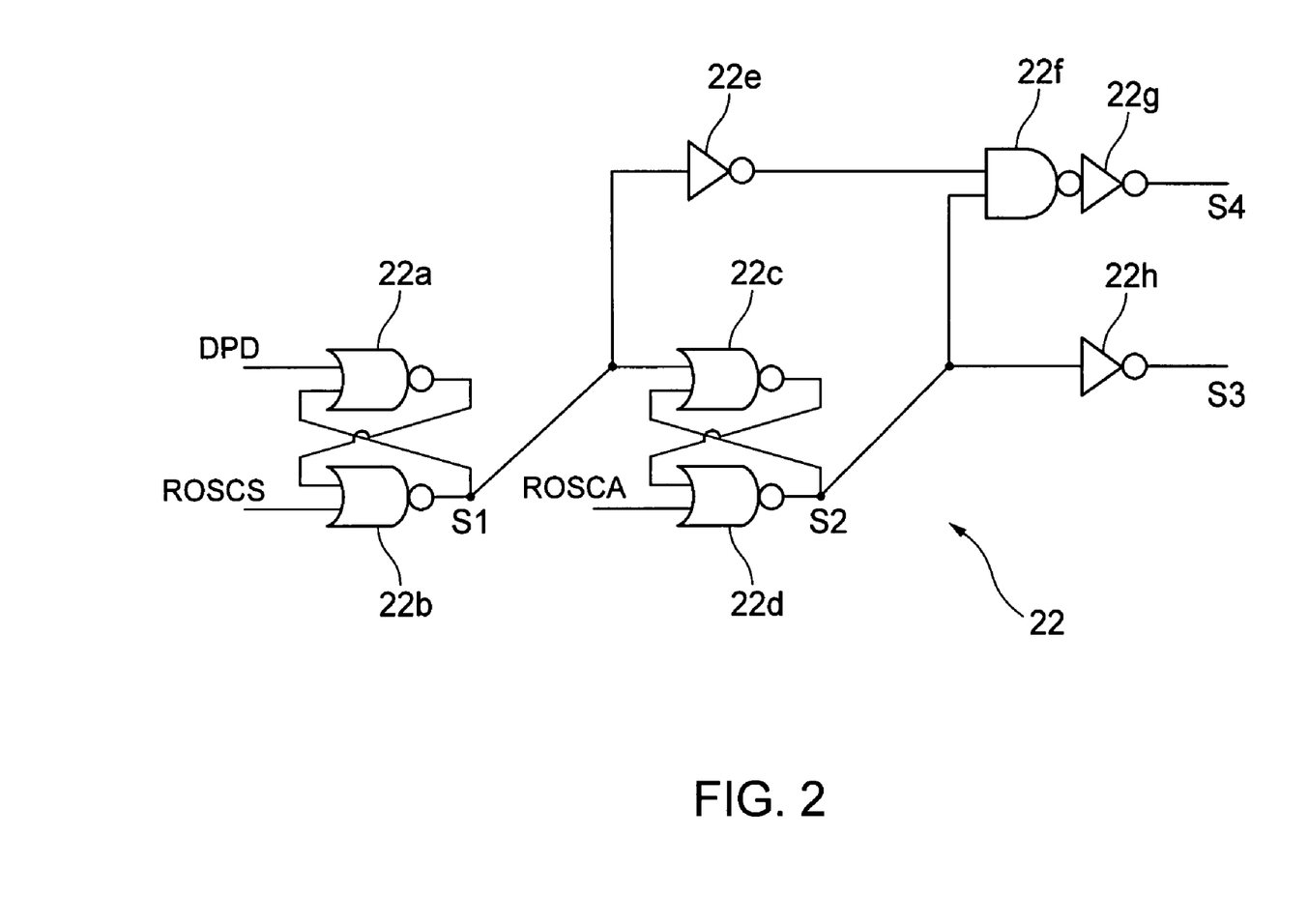
FIG. 2 is a circuit diagram showing an example of a circuit configuration of the control circuit 22 in the semiconductor storage apparatus 100 shown in FIG. 1.

FIG. 2 is a circuit diagram showing an example of a circuit configuration of the control circuit 22 in the semiconductor storage apparatus 100 shown in FIG. 1.

As shown in FIG. 2, the control circuit 22 includes a first NOR circuit 22a, a second NOR circuit 22b, a third NOR circuit 22c, a fourth NOR circuit 22d, a first inverter 22e, a first NAND circuit 22f, a second inverter 22g, and a third inverter 22h.

The first NOR circuit 22a is supplied with the DPD signal, and a signal (a first control signal S1) which is output by the second NOR circuit 22b. The second NOR circuit 22b is supplied with the signal ROSCS which is output by the second amplifier circuit 14, and a signal which is output by the first NOR circuit 22a.

The third NOR circuit 22c is supplied with the signal (the first control signal S1) which is output by the second NOR circuit 22b, and a signal (a second control signal S2) which is output by the fourth NOR circuit 22d. The seventh switch circuits 17a, 17b and 17c and the eighth switch circuit 18 are controlled according to the second control signal S2. The first switch circuit 4 and the second switch circuit 5 are adapted to be controlled according to the second control signal S2 and the deep power down signal DPD.

The fourth NOR circuit 22d is supplied with the signal ROSCA which is output by the first amplifier circuit 7, and a signal which is output by the third NOR circuit 22c.

The first inverter 22e is adapted to be supplied with the signal (the first control signal S1) which is output by the second NOR circuit 22b, and output a signal obtained by inverting logic of the input signal.

The first NAND circuit 22f is supplied with the signal which is output by the first inverter 22e and the signal (the second control signal S2) which is output by the fourth NOR circuit 22d.

The second inverter 22g is adapted to be supplied with a signal which is output by the first NAND circuit 22f and output a signal (a fourth control signal S4) obtained by inverting logic of the input signal. The first amplifier circuit 7 is adapted to be controlled according to the fourth control signal S4.

The third inverter 22h is adapted to be supplied with the signal (the second control signal S2) which is output by the fourth NOR circuit 22d and output a signal (a third control signal S3) obtained by inverting logic of the input signal. The ninth switch circuit 19 is adapted to be controlled according to the third control signal S3.

The third to sixth switch circuits 6 and 11 to 13 and the second amplifier circuit 14 are controlled according to the deep power down signal DPD.

An example of operation of the semiconductor storage apparatus 100 having the configuration described heretofore will now be described.

Figure 3:
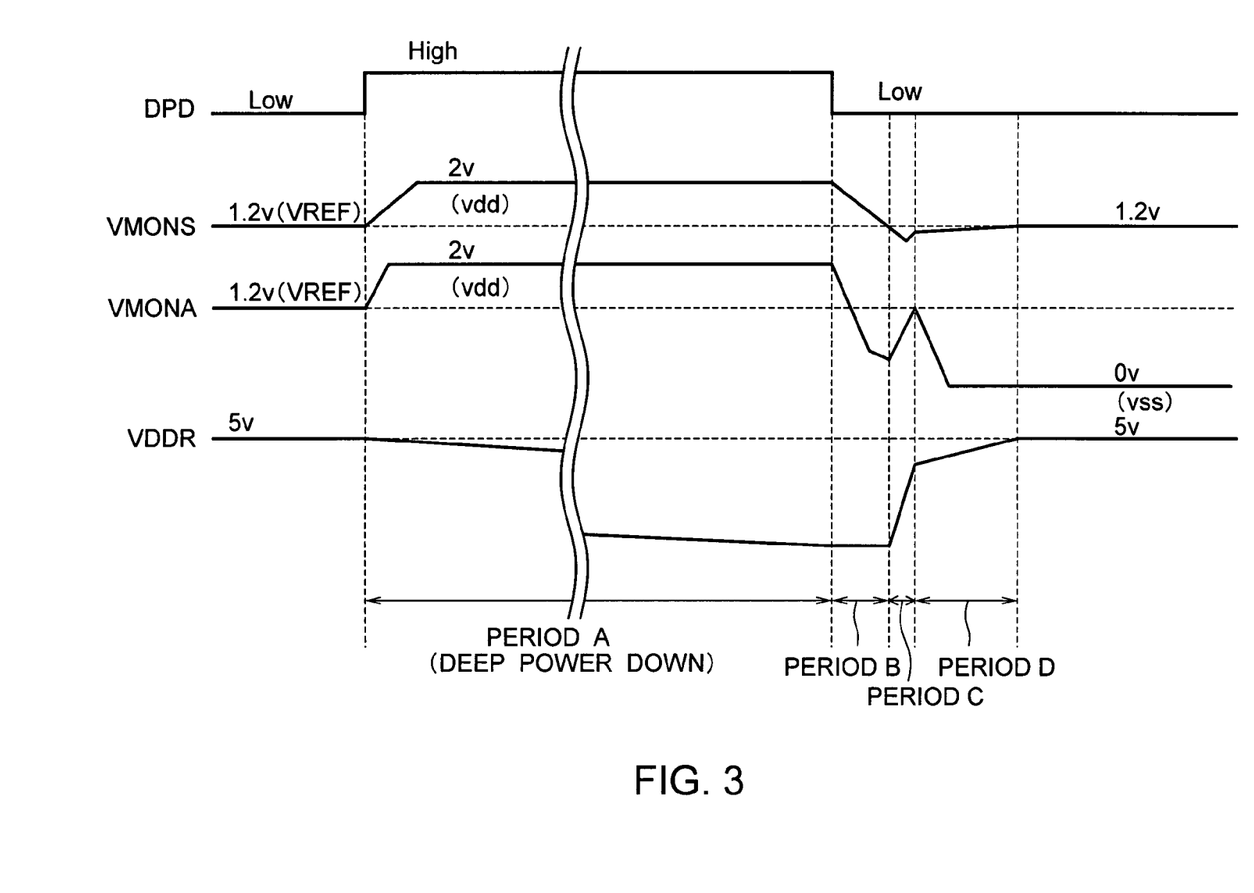
FIG. 3 is a diagram showing waveforms of signals generated by the semiconductor storage apparatus 100 shown in FIG. 1 in the case where the deep power down period is long.
Figure 4:
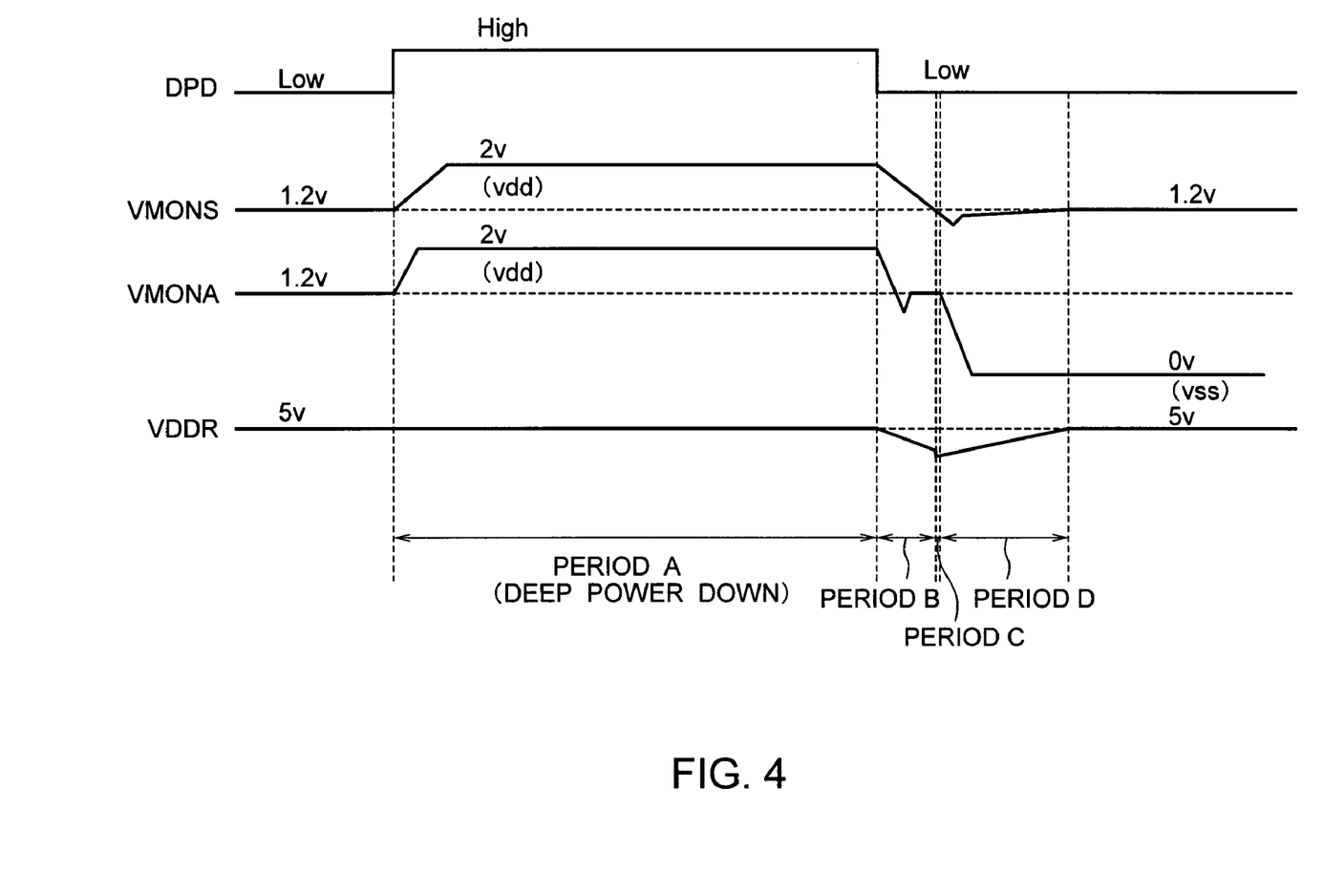
FIG. 4 is a diagram showing waveforms of the signals generated by the semiconductor storage apparatus 100 shown in FIG. 1 in the case where the deep power down period is short.
Figure 5:
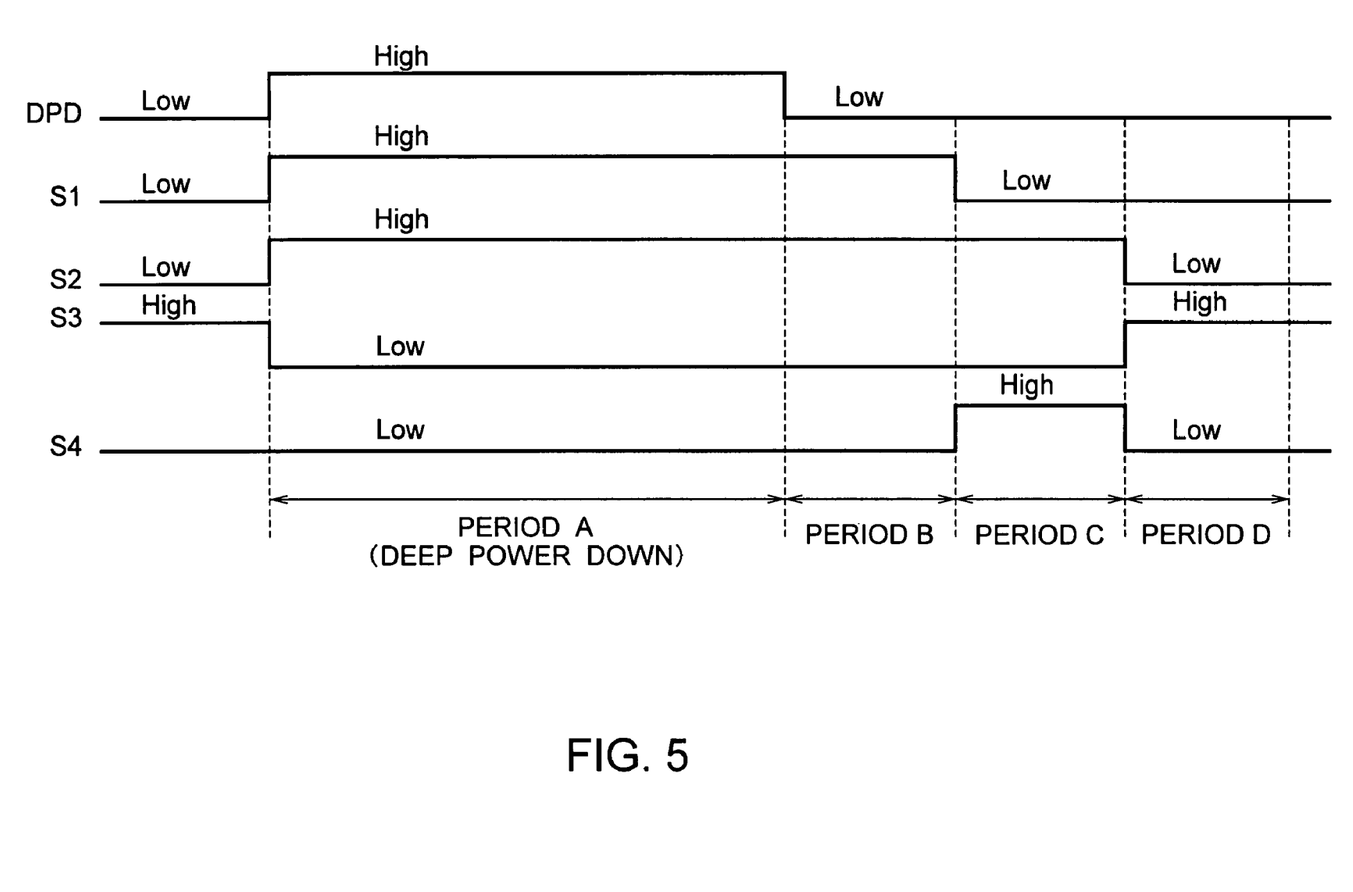
FIG. 5 is a waveform diagram showing an example of the control signals generated by the control circuit 22 in the semiconductor storage apparatus 100 shown in FIG. 1.

FIG. 3 is a diagram showing waveforms of signals generated by the semiconductor storage apparatus 100 shown in FIG. 1 in the case where the deep power down period is long. FIG. 4 is a diagram showing waveforms of the signals generated by the semiconductor storage apparatus 100 shown in FIG. 1 in the case where the deep power down period is short. FIG. 5 is a waveform diagram showing an example of the control signals generated by the control circuit 22 in the semiconductor storage apparatus 100 shown in FIG. 1.

In FIGS. 3 to 5, a "High" level of the deep power down signal DPD which is an external signal prescribes reduction of the current dissipation of the power supply which supplies the power supply voltage Vdd (i.e., the deep power down state of the NOR flash memory 100), whereas a "Low" level of the deep power down signal DPD prescribes reduction cancel of the current dissipation of the power supply (i.e., the deep power down cancel state of the NOR flash memory 100). Periods A to D shown in FIG. 5 are the same as periods A to D shown in FIG. 3 or FIG. 4.

As shown in FIGS. 3 to 5, the control signals S1 to S4 which are generated by the control circuit 22 prescribe, for example, a period A for the deep power down period and three periods B, C and D for after the deep power down is canceled.

The period B is a period lasting from end of the period A until the second amplifier circuit 14 corresponding to the second pump circuit (the standby pump circuit) 16 detects falling of the boost voltage VDDR. The period C is a period lasting from end of the period B until the first amplifier circuit 7 corresponding to the first pump circuit (the active pump circuit) 9 detects boost end of the boost voltage VDDR. In the period D, remaining potentials are boosted by only the second pump circuit 16.

Hereafter, operation of the semiconductor storage apparatus 100 will be described in more detail.

First, the control circuit 22 deactivates the first amplifier circuit 7 and the second amplifier circuit 14 in response to a second external signal (a "High" level of the deep down signal DPD) corresponding to a reduction request of the current dissipation. In addition, since at this time DPD="High" level, ROSCA="Low" level and ROSCS="Low" level, it follows that the first control signal S1="High" level, the second control signal S2="High" level, the third control signal S3="Low" level and the fourth control signal S4="Low" level as shown in FIG. 5. In other words, the control circuit 22 turns off the first, second, fourth and fifth switch circuits 4, 5, 11 and 12, and turns on the third and sixth switch circuits 6 and 13 in response to the second external signal (the period A).

As a result, the potential at the first and second voltage divider circuits 3 and 10 rises up to the power supply voltage Vdd. In addition, since the first and second amplifier circuits 7 and 14 are not conducting the boost operation, the boost voltage VDDR gradually falls. In FIG. 3, the deep power down period is long, and consequently the boost voltage VDDR falls so as to become lower than a target value (for example, 5.0 V). On the other hand, in FIG. 4, the deep power down period is short and consequently the boost voltage VDDR is kept in the neighborhood of the target value.

In the embodiment, the first and second monitor voltages VMONS and VMONA are reset to the power supply voltage Vdd during the DPD period. If the first and second monitor voltages VMONS and VMONA are reset to, for example, the ground here, then the boost voltage VDDR is judged to be lower than the target value after the DPD is canceled. Therefore, even if the deep power down period is short and the boost voltage VDDR is kept in the neighborhood of the target value as shown in FIG. 4, there is a possibility that the boost voltage VDDR will be boosted. If the boost voltage VDDR is boosted more than needed, it takes a time for the boost voltage VDDR to approach the target value because there is no discharge path of the boost voltage VDDR and it is difficult to lower the voltage. Therefore, the boost voltage VDDR is prevented from being judged to be lower than the target value by resetting the first and second monitor voltages VMONS and VMONA to the power supply voltage Vdd.

The control circuit 22 turns on the seventh switch circuits 17a, 17b and 17c by using the second control signal S2 ("High" level), and thereby short-circuits the first voltage divider circuit 3 and the second voltage divider circuit 10. As a result, the composite resistance value of these two voltage divider circuits becomes smaller than the composite resistance value of the second voltage divider circuit 10.

Furthermore, the control circuit 22 turns on the eighth switch circuit 18 by using the second control signal S2 ("High" level) and turns off the ninth switch circuit 19 by using the third control signal S3 ("Low" level). As a result, the first voltage division ratio D1 is set so as to become lower than the second voltage division ratio D2.

During the period B, the control circuit 22 activates the second amplifier circuit 14 in response to a first external signal ("Low" level of the deep power down signal DPD) corresponding to reduction request cancel of the current dissipation.

At this time, DPD="Low" level, ROSCA="Low" level, and ROSCS="Low" level. It follows that the first control signal S1="High" level, the second control signal S2="High" level, the third control signal S3="Low" level and the fourth control signal S4="Low" level as shown in FIG. 5. In other words, in response to the first external signal, the control circuit 22 turns on the first switch circuit 4, the second switch circuit 5, the fourth switch circuit 11 and the fifth switch circuit 12, and turns off the third switch circuit 6 and the sixth switch circuit 13.

The first monitor voltage VMONA of the first voltage divider circuit 3 is fast in response speed. Therefore, undershoot occurs when the first monitor voltage VMONA makes a transition from the power supply voltage Vdd to the reference voltage VREF after the DPD cancel (current dissipation reduction request cancel). If the first pump circuit 9 operates, therefore, there is a possibility that the boost voltage VDDR will be boosted falsely.

During the period B, therefore, only the second amplifier circuit 14 using the second voltage divider circuit 10 which is slow in response speed and which is not apt to cause undershoot is caused to operate, and the operation of the first pump circuit 9 is stopped until the second amplifier circuit 14 detects falling of the boost voltage VDDR.

Upon judging the boost voltage VDDR to be lower than the target value, the second amplifier circuit 14 outputs the second boost signal (ROSCS="High" level). The control circuit 22 activates the first amplifier circuit 7 in response to the second boost signal. At this time, the first monitor voltage VMONA is lower than the reference voltage VREF. Therefore, the first amplifier circuit 7 outputs the first boost signal (ROSCA="High" level), and the first pump circuit 9 starts the boost operation (the period C). As a result, DPD="Low" level, ROSCA="High" level and ROSCS="High" level. As shown in FIG. 5, therefore, it follows that the first control signal S1="Low" level, the second control signal S2="High" level, the third control signal S3="Low" level, and the fourth control signal S4="High" level.

In other words, the control circuit 22 causes the first pump circuit 9 to conduct boost operation during the period C by using the fourth control signal S4 ("High" level). Furthermore, the control circuit 22 continues to keep the seventh switch circuits 17a, 17b and 17c in the on-state, and the first voltage divider circuit 3 and the second voltage divider circuit 10 remain short-circuited to each other by using the second control signal S2 ("High" level).

The reason why the period C is provided is that the first pump circuit 9 is caused to operate in order to shorten the restoration time.

Even if the first voltage divider circuit 3 corresponding to the first pump circuit 9 which is fast in response speed and the second voltage divider circuit 10 corresponding to the second pump circuit 16 are short-circuited to each other as described above, the second monitor voltage VMONS in the second voltage divider circuit 10 is delayed as compared with the first monitor voltage VMONA, and it might fall because of capacitive division of the parasitic capacitance after the short-circuit is canceled. If in this case the boost voltage VDDR is completely boosted up to the target value by the first pump circuit 9, the boost voltage VDDR is boosted falsely by the second pump circuit 16 thereafter.

Therefore, the control circuit 22 holds the eighth switch circuit 18 in the on-state and the ninth switch circuit 19 in the off-state at least over a period in which the first amplifier circuit 7 is in the activated state. As a result, the control circuit 22 exercises control so as to make the first voltage division ratio D1 lower than the second voltage division ratio D2 at least over the period in which the first amplifier circuit 7 is in the activated state. Therefore, the control circuit 22 can control the first voltage division ratio D1 in the first voltage divider circuit 3 and the second voltage division ratio D2 in the second voltage divider circuit 10.

In this way, the first voltage division ratio D1 in the first voltage divider circuit 3 is made high in the period C to raise the first monitor voltage VMONA. When the boost voltage VDDR is boosted to a potential which is slightly lower than the target value, the first pump circuit 9 is stopped.

At least over the period C in which the first amplifier circuit 7 is in the activated state, the control circuit 22 may turn on the seventh switch circuits 17a, 17b and 17c. In this way, the first voltage divider circuit 3 which is fast in response speed and the second voltage divider circuit 10 which is slow in response speed may be short-circuited to each other. As a result, the response speed of the first pump circuit 9 can be further quickened, and the restoration start of the semiconductor storage apparatus (NOR flash memory) 100 can be put ahead.

Upon judging the boost voltage VDDR to be higher than the target value, the first amplifier circuit 7 outputs the first stop signal (ROSCA="Low" level). As a result, DPD="Low" level, ROSCA="Low" level, and ROSCS="High" level. As shown in FIG. 5, therefore, it follows that the first control signal S1="Low" level, the second control signal S2="Low" level, the third control signal S3="High" level, and the fourth control signal S4="Low" level (period D).

In other words, the control circuit 22 inactivates the first amplifier circuit 7 and turns off the first switch circuit 4 in response to the first stop signal. As a result, the control circuit 22 stops the boost operation of the first amplifier circuit 7 which is high in boost capability at timing of arrival of the first monitor voltage VMONA at the reference voltage VREF.

In addition, the control circuit 22 turns off the seventh switch circuits 17a, 17b and 17c by using the second control signal S2 ("Low" level), and insulates the first voltage divider circuit 3 from the second voltage divider circuit 10. Furthermore, the control circuit 22 turns off the eighth switch circuit 18 by using the second control signal S2 ("Low" level) and turns on the ninth switch circuit 19 by using the third control signal S3 ("High" level). As a result, the first voltage division ratio D1 is restored to its original value.

Even if the deep power down period changes, the semiconductor storage apparatus 100 can boost the boost voltage VDDR to the target value more swiftly as heretofore described.

In this way, the semiconductor storage apparatus 100 can boost the boost voltage VDDR to the target value more swiftly. As a result, the desired operation can be started more swiftly. Therefore, for example, the read operation of the NOR flash memory can be started swiftly, or the margin of the read operation can be improved.

SECOND EMBODIMENT

In the second embodiment, an example of a semiconductor storage apparatus having a configuration for adjusting the boost voltage VDDR in addition to the configuration in the first embodiment will be described.

As for the boost voltage VDDR, the target value (fuse data) is automatically read out from a fuse element (for example, a ROM) or the like, for example, when the power supply is turned on, and the voltage division ratios respectively of the voltage divider circuits are set.

If the boost voltage VDDR is boosted to a certain voltage in, for example, an indefinite state before the fuse data settles, then it might be necessary to lower the setting voltage of the boost voltage when the fuse data has settled. In this case, the boost voltage VDDR cannot be lowered swiftly because there is no discharge path for the output terminal 1 at which the boost voltage VDDR is output.

Before the fuse data settles, therefore, the boost voltage is forcibly fixed to a lowest value in the adjustment range (i.e., the voltage division ratio in each voltage divider circuit is fixed to a highest value in its adjustment range), and the boost voltage VDDR is boosted. After the fuse data settles, the boost voltage is re-boosted to a preset target value. Hereafter, the second embodiment will be described in more detail.

Figure 6:
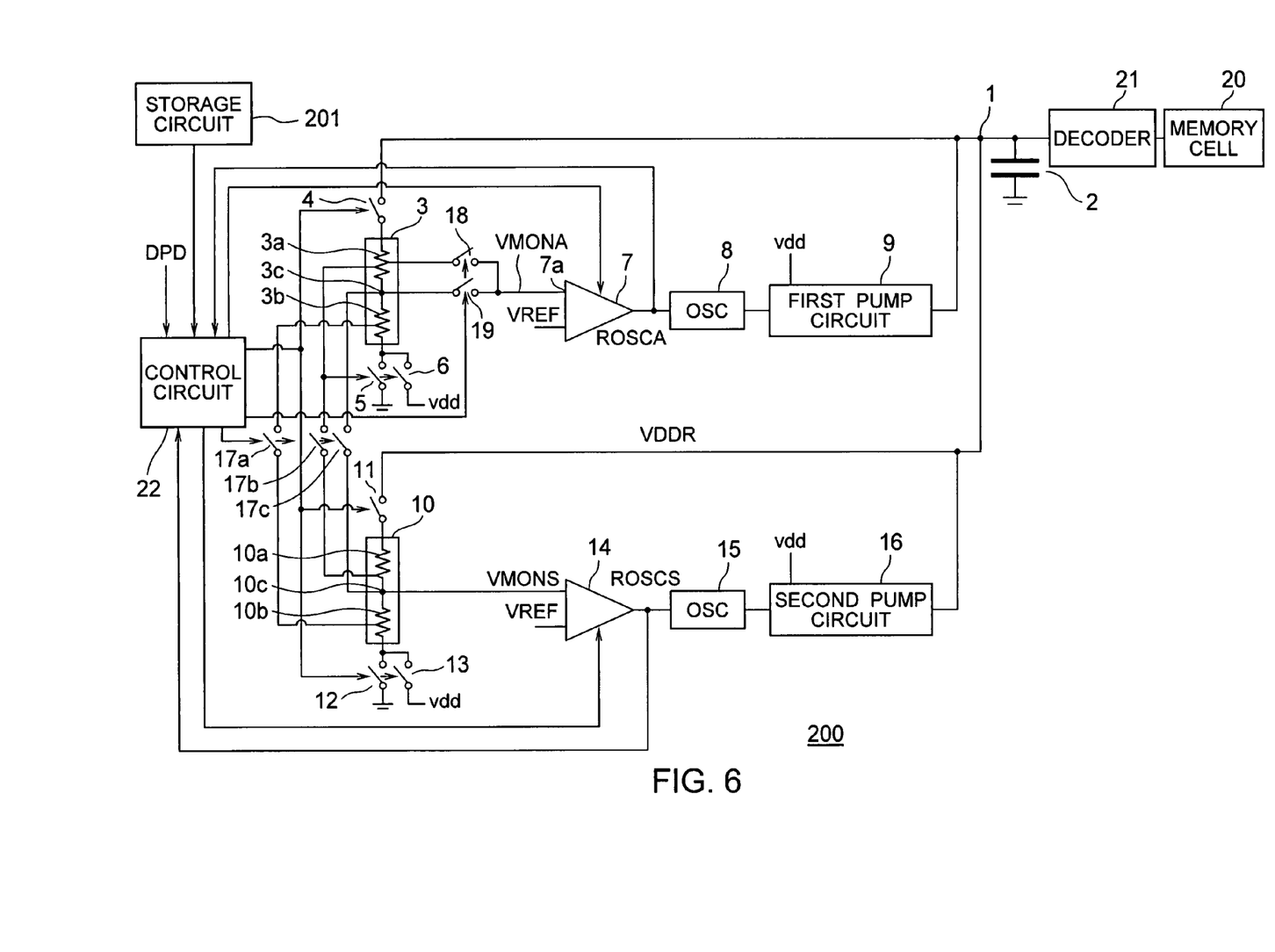
FIG. 6 is a diagram showing an example of a configuration of a semiconductor storage apparatus 200 according to the second embodiment, which is a mode of the present invention. Components denoted by the same characters as those in the first embodiment are components like those in the first embodiment.

FIG. 6 is a diagram showing an example of a configuration of a semiconductor storage apparatus 200 according to the second embodiment, which is a mode of the present invention. Components denoted by the same characters as those in the first embodiment are components like those in the first embodiment.

As shown in FIG. 6, the semiconductor storage apparatus 200 further includes a storage circuit 201 as compared with the semiconductor storage apparatus 100 in the first embodiment.

The storage circuit 201 is adapted to store a predetermined voltage division ratio DP in a prescribed adjustment range. The predetermined voltage division ratio DP corresponds to the target value of the boost voltage VDDR. The storage circuit 201 is, for example, a ROM such as a fuse element. The storage circuit 201 may be replaced by the memory cell 20.

In the second embodiment, the control circuit 22 can control the first voltage division ratio D1 in the first voltage divider circuit 3 and the second voltage division ratio D2 in the second voltage divider circuit 10.

An example of operation conducted in the semiconductor storage apparatus 200 having the configuration heretofore described, to adjust the boost voltage VDDR will now be described. Other operations of the semiconductor storage apparatus 200 are the same as those of the semiconductor storage apparatus 100 in the first embodiment already described.

Figure 7:
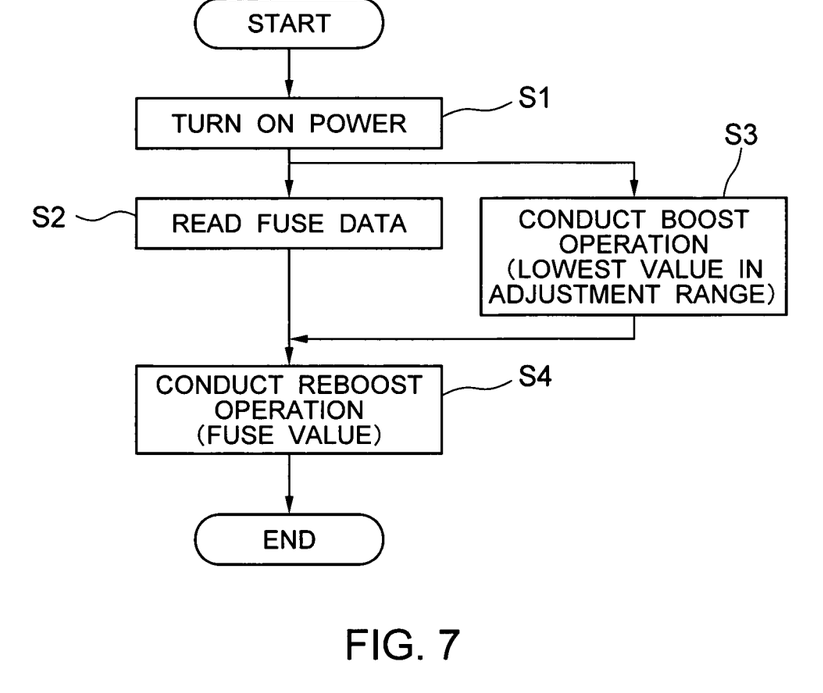
FIG. 7 is a diagram showing a flow of operation conducted in the semiconductor storage apparatus 200 according to the second embodiment, which is a mode of the present invention, to adjust the boost voltage VDDR.

FIG. 7 is a diagram showing a flow of operation conducted in the semiconductor storage apparatus 200 according to the second embodiment, which is a mode of the present invention, to adjust the boost voltage VDDR.

First, the power supply is turned on in the semiconductor storage apparatus 200 (step S1).

Then, the control circuit 22 reads out the predetermined voltage division ratio DP corresponding to the target value of the boost voltage VDDR from the storage circuit 201 (step S2).

Meanwhile after the step S1, the control circuit 22 sets the first voltage division ratio D1 and the second voltage division ratio D2 to a highest value DMAX in the adjustment range in parallel with reading out the predetermined voltage division ratio DP from the storage circuit 201 (step S3). The highest value DMAX corresponds to a lowest value VMIN in the voltage adjustment range of the boost voltage VDDR.

As a result, the semiconductor storage apparatus 200 boosts the boost voltage VDDR from the ground level to the lowest value VMIN.

Then, the control circuit 22 exercises control to set the first voltage division ratio D1 and the second voltage division ratio D2 equal to the predetermined voltage division ratio DP corresponding to the target value of the boost voltage VDDR in response to the second stop signal (end of the period D). As a result, after the boost voltage VDDR has arrived at the lowest value VMIN (after the end of the period D), the semiconductor storage apparatus 200 re-boosts the boost voltage VDDR to the target value (step S4).

In this way, the semiconductor storage apparatus 200 can boost the boost voltage VDDR to the target value more suitably and more swiftly without excessively boosting.

As a result, the semiconductor storage apparatus 200 can boost the boost voltage VDDR to the target value more swiftly. Therefore, the desired operation can be started more suitably and more swiftly.

APPLICATION EMBODIMENT

The application of the semiconductor storage apparatus (the NOR flash memories) 100 and 200 according to the embodiments described above is not particularly limited, and the NOR flash memories 100 and 200 can be used as a storage device for various types of electric or electronic apparatus. In addition, the NOR flash memories 100 and 200 can be housed in the same package as another memory, such as a NAND flash memory. In the following, a case in which the semiconductor storage apparatus (the NOR flash memories) 100 according to the embodiment 1 is used will be described. However, the semiconductor storage apparatus (the NOR flash memories) according to the embodiments 2 can also be used in the same way.

Figure 8:
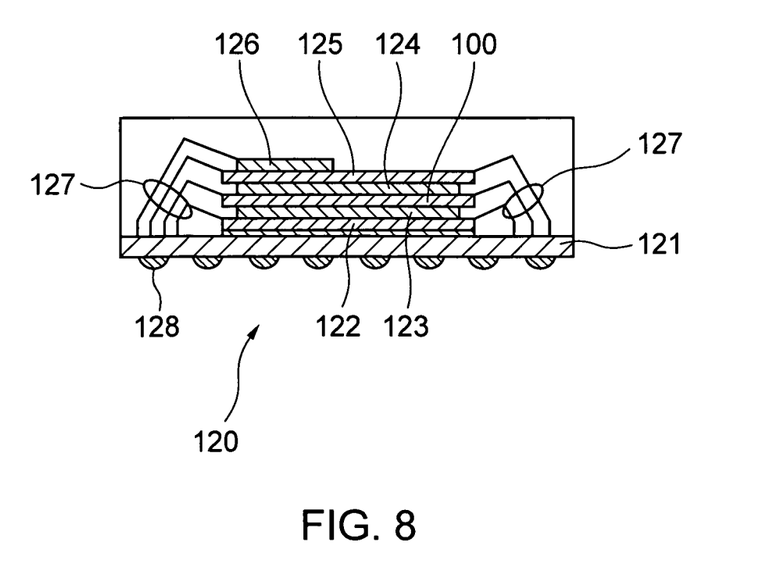
FIG. 8 is a cross-sectional view of an exemplary semiconductor chip (multi chip package: MCP) 120 incorporating the semiconductor storage apparatus (the NOR flash memories) 100 described in the embodiment 1 and another memory.

FIG. 8 is a cross-sectional view of an exemplary semiconductor chip (multi chip package: MCP) 120 incorporating the semiconductor storage apparatus (the NOR flash memories) 100 described in the embodiment 1 and another memory.

As shown in FIG. 8, the semiconductor chip 120 has a substrate 121, and a NAND flash memory 122, a spacer 123, the NOR flash memory 100, a spacer 124, a pseudo static random access memory (PSRAM) 125 and a controller 126 stacked in this order on a substrate 121, which are incorporated in the same package.

The NAND flash memory 122 has a plurality of memory cells capable of storing multivalued data, for example. Alternatively, the semiconductor chip 120 may have a synchronous dynamic random access memory (SDRAM) instead of the PSRAM.

Of the memories described above, depending on the use by the memory system, the NAND flash memory 122 is used as a data storing memory, for example. The NOR flash memory 100 is used as a program storing memory, for example. The PSRAM 125 is used as a work memory, for example.

The controller 126 primarily controls input/output of data to/from the NAND flash memory 122 and manages data in the NAND flash memory 122. The controller 126 has an ECC correcting circuit (not shown), and adds an error-correcting code (ECC) in data writing and performs analysis and processing of an error-correcting code in data reading.

The NAND flash memory 122, the NOR flash memory 100, the PSRAM 125 and the controller 126 are bonded to the substrate 121 by a wire 127.

Each solder ball 128 formed on the back surface of the substrate 121 is electrically connected to the corresponding wire 127. For example, the package is a surface-mounted ball grid array (BGA) in which the solder balls 128 are two-dimensionally arranged.

Next, a case where the semiconductor chip 120 described above is used in a cellular phone, which is an example of the electronic apparatus, will be described.

Figure 9:
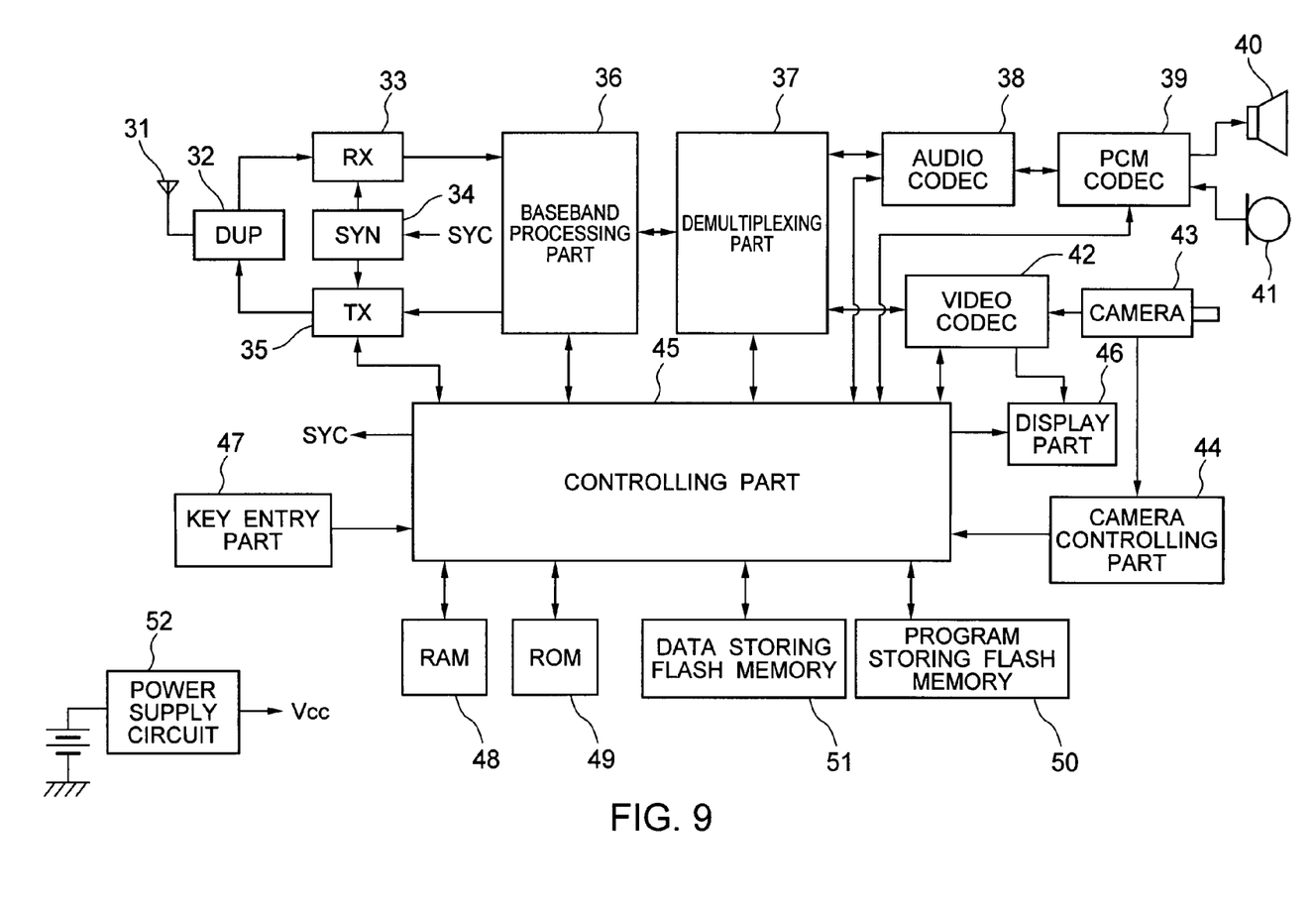
FIG. 9 is a block diagram showing an exemplary internal configuration of a cellular phone of this type.

FIG. 9 is a block diagram showing an exemplary internal configuration of a cellular phone of this type. The cellular phone shown in FIG. 9 has an antenna 31, an antenna duplexer 32 that switches between transmission and reception signals, a receiving circuit 33 that converts a radio signal into a baseband signal, a frequency synthesizer 34 that generates a local oscillation signal for transmission and reception, a transmitting circuit 35 that generates a radio signal by modulating a transmission signal, a baseband processing part 36 that generates a reception signal of a predetermined transmission format based on the base band signal, a demultiplexing part 37 that separates the reception signal into audio, video and text data, an audio codec 38 that decodes the audio data into a digital audio signal, a PCM codec 39 that PCM-decodes the digital audio signal to generates an analog audio signal, a speaker 40, a microphone 41, a video codec 42 that decodes the video data into a digital video signal, a camera 43, a camera controlling part 44, a controlling part 45 that controls the whole of the cellular phone, a display part 46, a key entry part 47, a RAM 48, a ROM 49, a program storing flash memory 50, a data storing flash memory 51 and a power supply circuit 52.

In FIG. 9, the program storing flash memory 50 is the NOR flash memory 100 according to the embodiment 1 described above, and the data storing flash memory 51 is the NAND flash memory 22.

From the above description, those skilled in the art will appreciate additional advantages and be able to devise various modifications. Therefore, the aspects of the present invention are not limited to the embodiments specifically described above. Various additions, modifications, and partial omissions are possible without departing from the concept and spirit of the present invention, which are derived from the contents defined by the claims and equivalents thereto.

What is claimed is:

1. A semiconductor storage apparatus comprising:
   an output terminal;
   a pool capacitor connected between the output terminal and ground;
   a first voltage divider circuit connected between the output terminal and the ground to output a first monitor voltage obtained by dividing a voltage which is output from the output terminal with a first voltage division ratio;
   a first switch circuit connected between the output terminal and the first voltage divider circuit;
   a second switch circuit connected between the first voltage divider circuit and the ground;
   a third switch circuit connected between a first potential which is higher than a reference voltage and the first voltage divider circuit;
   a first amplifier circuit which compares the first monitor voltage with the reference voltage, outputs a first boost signal if the first monitor voltage is lower than the reference voltage, and outputs a first stop signal if the first monitor voltage is higher than the reference voltage;
   a first pump circuit which outputs a voltage obtained by boosting a power supply voltage to the output terminal in response to the first boost signal;
   a second voltage divider circuit connected between the output terminal and the ground to output a second monitor voltage obtained by dividing a voltage which is output from the output terminal with a second voltage division ratio, the second voltage division ratio being equal to the first voltage division ratio, the second voltage divider circuit being greater in resistance value than the first voltage divider circuit;
   a fourth switch circuit connected between the output terminal and the second voltage divider circuit;
   a fifth switch circuit connected between the second voltage divider circuit and the ground;
   a sixth switch circuit connected between the first potential which is higher than the reference voltage and the second voltage divider circuit;
   a second amplifier circuit which compares the second monitor voltage with the reference voltage, outputs a second boost signal if the second monitor voltage is lower than the reference voltage, and outputs a second stop signal if the second monitor voltage is higher than the reference voltage;
   a second pump circuit which outputs a voltage obtained by boosting the power supply voltage to the output terminal in response to the second boost signal, the second pump circuit being lower in boosting capability than the first pump circuit;
   a control circuit which controls activation/deactivation of the first amplifier circuit and the second amplifier circuit, and controls on/off of the first to sixth switch circuits;
   a memory cell which stores data; and
   a decoder which supplies a voltage depending upon the boost voltage output from the output terminal, to the memory cell,
   wherein the control circuit deactivates the first and second amplifier circuits, turns off the first, second, fourth and fifth switch circuits, and turns on the third and sixth switch circuits in response to an external signal based on reduction of current dissipation of a power supply which supplies the power supply voltage.

2. The semiconductor storage apparatus according to claim 1, wherein
   the control circuit activates the second amplifier circuit, turns on the first, second, fourth and fifth switch circuits, and turns off the third and sixth switch circuits in response to an external signal based on reduction cancel of current dissipation of the power supply,
   then, the control circuit activates the first amplifier circuit in response to the second boost signal, and
   then, the control circuit deactivates the first amplifier circuit and turns off the first switch circuit in response to the first stop signal.

3. The semiconductor storage apparatus according to claim 1, comprising a seventh switch circuit connected between the first voltage divider circuit and the second voltage divider circuit so as to maintain the first voltage division ratio in the first voltage divider circuit and the second voltage division ratio in the second voltage divider circuit when the seventh switch circuit is turned on,
   wherein, at least over a period in which the first amplifier circuit is in the activated state, the control circuit turns on the seventh switch circuit.

4. The semiconductor storage apparatus according to claim 2, comprising a seventh switch circuit connected between the first voltage divider circuit and the second voltage divider circuit so as to maintain the first voltage division ratio in the first voltage divider circuit and the second voltage division ratio in the second voltage divider circuit when the seventh switch circuit is turned on,
   wherein, at least over a period in which the first amplifier circuit is in the activated state, the control circuit turns on the seventh switch circuit.

5. The semiconductor storage apparatus according to claim 1, wherein the control circuit exercises control so as to make the first voltage division ratio lower than the second voltage division ratio at least over a period in which the first amplifier circuit is in the activated state.

6. The semiconductor storage apparatus according to claim 2, wherein the control circuit exercises control so as to make the first voltage division ratio lower than the second voltage division ratio at least over a period in which the first amplifier circuit is in the activated state.

7. The semiconductor storage apparatus according to claim 3, wherein the control circuit exercises control so as to make the first voltage division ratio lower than the second voltage division ratio at least over a period in which the first amplifier circuit is in the activated state.

8. The semiconductor storage apparatus according to claim 1, comprising a storage circuit to store a predetermined voltage division ratio in a predetermined adjustment range, wherein
the control circuit can control the first voltage division ratio in the first voltage divider circuit and the second voltage division ratio in the second voltage divider circuit,
the control circuit reads out the predetermined voltage division ratio from the storage circuit and sets the first voltage division ratio and the second voltage division ratio equal to a highest value in the adjustment range, in response to the external signal corresponding to turning-on of the power supply, and
the control circuit exercises control to make the first voltage division ratio and the second voltage division ratio equal to the predetermined voltage division ratio in response to the second stop signal.

9. The semiconductor storage apparatus according to claim 2, comprising a storage circuit to store a predetermined voltage division ratio in a predetermined adjustment range, wherein
the control circuit can control the first voltage division ratio in the first voltage divider circuit and the second voltage division ratio in the second voltage divider circuit,
the control circuit reads out the predetermined voltage division ratio from the storage circuit and sets the first voltage division ratio and the second voltage division ratio equal to a highest value in the adjustment range, in response to the external signal corresponding to turning-on of the power supply, and
the control circuit exercises control to make the first voltage division ratio and the second voltage division ratio equal to the predetermined voltage division ratio in response to the second stop signal.

10. The semiconductor storage apparatus according to claim 3, comprising a storage circuit to store a predetermined voltage division ratio in a predetermined adjustment range, wherein
the control circuit can control the first voltage division ratio in the first voltage divider circuit and the second voltage division ratio in the second voltage divider circuit,
the control circuit reads out the predetermined voltage division ratio from the storage circuit and sets the first voltage division ratio and the second voltage division ratio equal to a highest value in the adjustment range, in response to the external signal corresponding to turning-on of the power supply, and
the control circuit exercises control to make the first voltage division ratio and the second voltage division ratio equal to the predetermined voltage division ratio in response to the second stop signal.

11. The semiconductor storage apparatus according to claim 4, comprising a storage circuit to store a predetermined voltage division ratio in a predetermined adjustment range, wherein
the control circuit can control the first voltage division ratio in the first voltage divider circuit and the second voltage division ratio in the second voltage divider circuit,
the control circuit reads out the predetermined voltage division ratio from the storage circuit and sets the first voltage division ratio and the second voltage division ratio equal to a highest value in the adjustment range, in response to the external signal corresponding to turning-on of the power supply, and
the control circuit exercises control to make the first voltage division ratio and the second voltage division ratio equal to the predetermined voltage division ratio in response to the second stop signal.

12. The semiconductor storage apparatus according to claim 5, comprising a storage circuit to store a predetermined voltage division ratio in a predetermined adjustment range, wherein
the control circuit can control the first voltage division ratio in the first voltage divider circuit and the second voltage division ratio in the second voltage divider circuit,
the control circuit reads out the predetermined voltage division ratio from the storage circuit and sets the first voltage division ratio and the second voltage division ratio equal to a highest value in the adjustment range, in response to the external signal corresponding to turning-on of the power supply, and
the control circuit exercises control to make the first voltage division ratio and the second voltage division ratio equal to the predetermined voltage division ratio in response to the second stop signal.

13. The semiconductor storage apparatus according to claim 8, wherein the storage circuit is the memory cell.

14. The semiconductor storage apparatus according to claim 9, wherein the storage circuit is the memory cell.

15. The semiconductor storage apparatus according to claim 10, wherein the storage circuit is the memory cell.

16. The semiconductor storage apparatus according to claim 8, wherein the storage circuit is a fuse element.

17. The semiconductor storage apparatus according to claim 9, wherein the storage circuit is a fuse element.

18. The semiconductor storage apparatus according to claim 10, wherein the storage circuit is a fuse element.

19. The semiconductor storage apparatus according to claim 1, wherein the first potential is the power supply voltage.

20. The semiconductor storage apparatus according to claim 1, wherein the semiconductor storage apparatus is a NAND flash memory.

* * * * *